(12) United States Patent
Ishimatsu

(10) Patent No.: US 8,980,043 B2
(45) Date of Patent: Mar. 17, 2015

(54) ANISOTROPIC CONDUCTIVE FILM, JOINED STRUCTURE AND METHOD FOR PRODUCING THE JOINED STRUCTURE

(75) Inventor: Tomoyuki Ishimatsu, Tochigi (JP)

(73) Assignee: Dexerials Corporation, Shinagawa-Ku, Tokyo (JP)

( * ) Notice: Subject to any disclaimer, the term of this patent is extended or adjusted under 35 U.S.C. 154(b) by 194 days.

(21) Appl. No.: 13/554,303

(22) Filed: Jul. 20, 2012

(65) Prior Publication Data

US 2012/0285603 A1 Nov. 15, 2012

Related U.S. Application Data

(60) Division of application No. 12/626,279, filed on Nov. 25, 2009, now Pat. No. 8,247,697, which is a continuation of application No. PCT/JP2009/054725, filed on Mar. 12, 2009.

(30) Foreign Application Priority Data

Mar. 27, 2008 (JP) .................. 2008-084423

(51) Int. Cl.
  B32B 37/00 (2006.01)
  H05K 3/32 (2006.01)
  H01L 23/00 (2006.01)

(52) U.S. Cl.
  CPC ............ *H05K 3/323* (2013.01); *H01L 24/29* (2013.01); *H05K 2203/1189* (2013.01);
  (Continued)

(58) Field of Classification Search
  USPC ............ 156/306.6, 306.9, 307.1, 307.7, 310, 156/313, 327, 330
  See application file for complete search history.

(56) References Cited

U.S. PATENT DOCUMENTS 6,214,446 B1   4/2001   Funada et al.
6,777,464 B1   8/2004   Watanabe et al.
(Continued)

FOREIGN PATENT DOCUMENTS

JP   04-118873 A   4/1992
JP   06-045024 A   2/1994
(Continued)

OTHER PUBLICATIONS

International Search Report for PCT/JP2009/069535 issued in copending U.S. Appl. No. 12/838,625, completed Jan. 15, 2010.
(Continued)

*Primary Examiner* — John Goff
(74) *Attorney, Agent, or Firm* — Buchanan, Ingersoll & Rooney PC

(57) ABSTRACT

A method for producing a joined structure, the method involving pressure-bonding first and second circuit members together via an anisotropic conductive film while the circuit members are being heated, to thereby join the circuit members with each other. The anisotropic conductive film electrically connects the first circuit member with the second circuit member having a nitrogen atom-containing film on a surface facing the first circuit member, wherein the anisotropic conductive film, the first layer and the second layer are further defined including the provisions that at least one of the first and second layers includes conductive particles, and the difference in maximum exothermic peak temperature between the first and second layers is within the range up to 20° C.

4 Claims, 4 Drawing Sheets

(52) U.S. Cl.
CPC ........... *H01L 2224/16225* (2013.01); *H01L 2224/32225* (2013.01); *H01L 2224/73204* (2013.01); *H01L 2924/07811* (2013.01)
USPC .............. 156/306.9; 156/307.1; 156/310; 156/313; 156/330

(56) References Cited

U.S. PATENT DOCUMENTS

| | | |
|---|---|---|
| 2003/0141014 A1 | 7/2003 | Satoyuki et al. |
| 2005/0229965 A1 | 10/2005 | Nishimura et al. |
| 2007/0054114 A1* | 3/2007 | Kumakura .................... 428/343 |
| 2007/0175579 A1* | 8/2007 | Otani et al. .................... 156/241 |
| 2010/0285305 A1 | 11/2010 | Akutsu et al. |

FOREIGN PATENT DOCUMENTS

| | | |
|---|---|---|
| JP | 11-251368 A | 9/1999 |
| JP | 2001-127107 A | 5/2001 |
| JP | 2003-045515 A | 2/2003 |
| JP | 3587859 B2 | 11/2004 |
| JP | 2005-235956 A | 9/2005 |
| JP | 2006-127776 A | 5/2006 |
| JP | 2007-027712 A | 2/2007 |
| JP | 2007-262412 A | 10/2007 |
| TW | 200523610 A | 7/2005 |
| TW | 285216 B | 8/2007 |
| WO | WO 00/46315 A1 | 8/2000 |
| WO | WO 2008/133186 A1 | 11/2008 |

OTHER PUBLICATIONS

Written Opinion of the International Searching Authority for PCT/JP2009/069535 issued in copending U.S. Appl. No. 12/838,625, completed Jan. 15, 2010.

International Search Report (PCT/ISA/210) for PCT/JP2009/054725 mailed Jun. 16, 2009.

Written Opinion (PCT/ISA/237) for PCT/JP2009/054725 mailed Jun. 16, 2009.

Rejection (Office Action), issued in Taiwanese Patent Application No. 10121484040 in the Taiwanese Patent Office on Dec. 22, 2012, and English translation thereof (7 pages).

* cited by examiner

ANISOTROPIC CONDUCTIVE FILM, JOINED STRUCTURE AND METHOD FOR PRODUCING THE JOINED STRUCTURE

CROSS-REFERENCE TO RELATED APPLICATION

The present application is a Divisional Application of U.S. application Ser. No. 12/626,279, filed Nov. 25, 2009, now U.S. Pat. No. 8,247,697, which is a continuation application of PCT/JP2009/54725, filed on Mar. 12, 2009 and claims foreign priority to Japanese Application No. 2008-084423, filed Mar. 27, 2008, the entire contents of each of which are incorporated by reference herein.

TECHNICAL FIELD

The present invention relates to an anisotropic conductive film, a joined structure, and a method for producing the joined structure. Specifically, the present invention relates to an anisotropic conductive film capable of electrically and mechanically connecting circuit members such as IC chips and liquid crystal display panels (LCD panels) in liquid crystal displays (LCDs); a joined structure having the anisotropic conductive film; and a method for producing the joined structure.

BACKGROUND ART

Conventionally, as one means of connecting circuit members with each other, connecting material tapes (e.g., anisotropic conductive films (ACFs)) have been used, which are formed by coating a release film with a thermoplastic resin containing conductive particles dispersed therein.

The anisotropic conductive films are used for adhering and electrically connecting various terminals with each other, for example, for connecting flexible printed circuits (FPCs) and/or terminals of IC chips with indium tin oxide (ITO) electrodes on glass substrates of LCD panels.

One practically used anisotropic conductive film is cationic-curable anisotropic conductive films each containing a cationic curing agent and an epoxy resin. The cationic-curable anisotropic conductive films realize curability at low temperatures and reduction of warpage of an adherend.

However, sulfonium salts, etc., serving as the cationic curing agent, have high curing activity and thus, the curing reaction is easily inhibited by, for example, even a trace amount of impurities, causing problematic phenomena such as poor curing.

In particular, such poor curing often occurs due to a passivation film of polyimide formed on the back surface of an IC chip. Specifically, in the case where an IC chip is connected via a cationic-curable anisotropic conductive film, at the time when the cationic-curable anisotropic conductive film is attached to the IC chip to initiate curing reaction, the generated cationic species ($H^+$) are inactivated by polyimide materials of the passivation film. One possible reason why the generated cationic species ($H^+$) are inactivated by the polyimide materials of the passivation film lies in that the cationic species ($H^+$) react with nitrogen atoms (N) contained in polyimide and are then trapped (the reaction $R_3N \rightarrow R_3N^+H$ occurs to form ammonium salts).

In addition, even when an IC chip is connected using a TAB tape formed by laminating a polyimide film on a Cu foil with an adhesive, the adhesive is made of polyamide and thus, causes inhibition of curing.

Another practically used anisotropic conductive film is radical-curable anisotropic conductive films each containing a radical curing agent (an organic peroxide) and an acrylic resin. The radical-curable anisotropic conductive films are often employed for connection at the PWB side, and realize satisfactory curability at low temperatures. However, the radical-curable anisotropic conductive films do not generate a hydroxyl group during curing and thus, the interaction between the film and the adherend having polarity becomes weak, causing problematic phenomena such as poor curing. In particular, the radical-curable anisotropic conductive film has poor adhesion to the glass surface at the LCD panel side, problematically causing peeling at the interface. The radical-curable anisotropic conductive film, therefore, is not suitable for connection at the LCD panel side, and also is not used widely.

In addition, a rubber material commonly used as the material for an anisotropic conductive film is easy to cause inhibition of curing, and use of the rubber material as a stress releaser after curing is limited. Also, the anisotropic conductive film made of the rubber material tends to be high in elastic modulus and Tg, easily causing strain of a base after curing.

Further, there is proposed a dual-curable anisotropic conductive film containing a radical curing agent (for curing at low temperatures) and an imidazole curing agent (for curing at high temperatures) (e.g., Japanese Application Laid-Open (JP-A) No. 2007-262412). However, an anisotropic conductive film formed from components having different curing mechanisms tends to cause phase separation during curing and to involve inner cracks, resulting in degraded connection reliability. Also, curing must be performed at two steps, which is not suitable for connection in a short time.

Furthermore, proposed are a dual-curable anisotropic conductive film formed from a radical curing agent and a cationic curing agent (e.g., JP-A No. 2006-127776); an anisotropic conductive film containing, in a binder, a heat-curable composition and a photo-curable composition (e.g., JP-A No. 2005-235956); and a two-layered anisotropic conductive film having a photo-cationic curing agent-containing layer and a photo-radical curing agent-containing layer (e.g., International Publication No. WO00/046315 pamphlet). Neither of them cannot improve curing failure by a passivation film of polyimide formed on the back surface of an IC chip. Thus, demand has arisen for development of an anisotropic conductive film which involves no curing failure by a passivation film of polyimide.

Further, in the recent display device members such as LCDs, PDPs and organic ELs, in use, wires of metal such as Al, Mo, Cr, Ti, Cu or Ni are often formed on a base of ITO from the viewpoint of, for example, electrical conductivity. Thus, it is difficult to connect circuit members with each other by photo-curing an anisotropic conductive film placed therebetween.

DISCLOSURE OF INVENTION

The present invention solves the existing problems pertinent in the art and aims to achieve the following objects. Specifically, an object of the present invention is to provide an anisotropic conductive film having enhanced adhesion strength to circuit members and attaining high conduction reliability; a joined structure; and a method for producing the joined structure.

Means for solving the problems are as follows.

<1> An anisotropic conductive film which electrically connects a first circuit member with a second circuit member having a nitrogen atom-containing film on a surface thereof facing the first circuit member, the anisotropic conductive film including:

a first layer which is to be located at a first circuit member side, and a second layer which is to be located at a second circuit member side, wherein the first layer contains a cationic curing agent and a first thermosetting resin, and the second layer contains a radical curing agent and a second thermosetting resin, and wherein at least one of the first and second layers contains conductive particles, and the difference in maximum exothermic peak temperature between the first and second layers is within the range up to 20° C.

In the anisotropic conductive film according to <1> above, the first layer containing the cationic curing agent and the first thermosetting resin is located at the first circuit member side, and the second layer containing the radical curing agent and the second thermosetting resin is located at the second circuit member side, the second circuit member having the nitrogen atom-containing film on the surface facing the first circuit member; and the difference in maximum exothermic peak temperature between the first and second layers is within the range up to 20° C. Thus, the anisotropic conductive film has improved adhesion strength to the circuit members, achieving high conduction reliability.

<2> The anisotropic conductive film according to <1> above, wherein the first thermosetting resin is an epoxy resin, and the second thermosetting resin is an acrylic resin.

<3> The anisotropic conductive film according to any one of <1> and <2 > above, wherein the cationic curing agent is a sulfonium salt, and the radical curing agent is an organic peroxide.

<4> The anisotropic conductive film according to any one of <1> to <3 > above, wherein the conductive particles are metal particles or metal-coated resin particles. <5> The anisotropic conductive film according to any one of <1> to <4 > above, wherein the second circuit member is made of a material which does not transmit light, and the first circuit member contains a metallic material.

<6> A joined structure including:

a first circuit member, a second circuit member having a nitrogen atom-containing film on a surface thereof facing the first circuit member, and an anisotropic conductive film which electrically connects the first circuit member with the second circuit member, wherein the anisotropic conductive film includes a first layer which is to be located at a first circuit member side, and a second layer which is to be located at a second circuit member side, wherein the first layer contains a cationic curing agent and a first thermosetting resin, and the second layer contains a radical curing agent and a second thermosetting resin, and wherein at least one of the first and second layers contains conductive particles, and the difference in maximum exothermic peak temperature between the first and second layers is within the range up of 20° C.

In the joined structure according to <6> above, the first layer containing the cationic curing agent and the first thermosetting resin is located at the first circuit member side, and the second layer containing the radical curing agent and the second thermosetting resin is located at the second circuit member side, the second circuit member having the nitrogen atom-containing film on the surface facing the first circuit member; and the difference in maximum exothermic peak temperature between the first and second layers is within the range up to 20° C. Thus, the anisotropic conductive film has improved adhesion strength to the circuit members, achieving high conduction reliability.

<7> A method for producing a joined structure, the method including:

pressure-bonding first and second circuit members together via the anisotropic conductive film according to any one of <1> to <5> above while the circuit members are being heated, to thereby join the circuit members with each other.

In the method for producing a joined structure, in a joining step, first and second circuit members are pressure-bonded together with heating via the anisotropic conductive film according to any one of <1> to <5> above, whereby the circuit members are joined with each other.

The present invention can provide an anisotropic conductive film having enhanced adhesion strength to circuit members and attaining high conduction reliability; a joined structure; and a method for producing the joined structure. These can solve the existing problems and achieve the above objects.

Also, according to the present invention, stress of connected circuit members can be reduced.

BEST MODE FOR CARRYING OUT THE INVENTION (Joined Structure)

Figure 1:
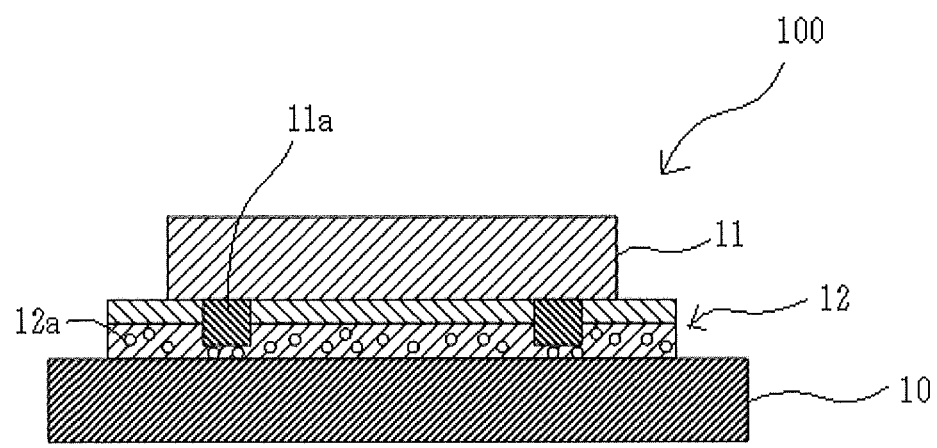
FIG. 1 is a schematic explanatory view of a joined structure of the present invention.

A joined structure of the present invention includes a first circuit member, a second circuit member and an anisotropic conductive film; and, if necessary, includes appropriately selected other members. For example, as shown in FIG. 1, a joined structure 100 has an LCD panel 10 as the first circuit member, an IC chip 11 as the second circuit member, and an anisotropic conductive film 12. When terminals 11a of the IC chip 11 are conducted through conductive particles 12a in the anisotropic conductive film 12 to unillustrated terminals of the LCD panel 10, the LCD panel 10 and the IC chip 11 are electrically connected with each other.

<First Circuit Member>

The first circuit member is not particularly limited and may be appropriately selected depending on the purpose. Examples thereof include LCD glass substrates, PDP glass substrates and organic EL glass substrates.

Also, the first circuit member has metal wires made, for example, of aluminum. When the first circuit member has wires made of a material which does not transmit light (e.g., aluminum), it is difficult to photo-cure the resin contained in an anisotropic conductive film. Thus, the resin contained in the anisotropic conductive film is preferably a thermosetting resin.

<Second Circuit Member>

The second circuit member is not particularly limited, so long as it has a nitrogen atom-containing film on the surface facing the first circuit member, and may be appropriately selected depending on the purpose. Examples thereof include IC chips each having a polyimide-containing passivation film, IC chips each having an $Si_3N_4$-containing passivation film, and TAB tapes each having a mounted IC chip.

Also, the second circuit member may be made of a material which does not transmit light. When the second circuit member is made of such material which does not transmit light, it is difficult to photo-curing the resin contained in an anisotropic conductive film. Thus, the resin contained in the anisotropic conductive film is preferably a thermosetting resin.

<Anisotropic Conductive Film>

Figure 2:
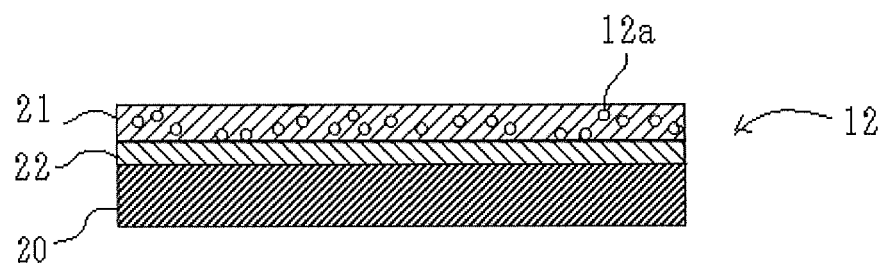
FIG. 2 is a schematic explanatory view of an anisotropic conductive film of the present invention.

The anisotropic conductive film includes a first layer and a second layer; and, if necessary, further includes an appropriately selected other layer. For example, as shown in FIG. 2, a conductive film 12 has a release layer (separator) 20, an insulative layer 22 serving as the second layer, and a conductive layer 21 serving as the first layer, wherein the insulative layer 22 is formed on the release layer (separator) 20, and the conductive layer 21 is formed on the insulative layer 22.

The conductive film 12 is attached, for example, such that the conductive layer 21 faces the LCD panel 10 (FIG. 1). Thereafter, the release layer (separator) 20 is peeled off, and the IC chip 11 (FIG. 1) is pressure-bonded from the side of the insulative layer 22, whereby the joined structure 100 (FIG. 1) is produced.

<<First Layer>>

The first layer is not particularly limited, so long as it is located at the first circuit member side, and contains a cationic curing agent and a first thermosetting resin, and may be appropriately selected depending on the purpose. Preferably, the first layer further contains conductive particles.

<<<Cationic Curing Agent>>>

The cationic curing agent is not particularly limited and may be appropriately selected depending on the purpose. Examples thereof include sulfonium salts and onium salts, with aromatic sulfonium salts being preferred.

<<<First Thermosetting Resin>>>

The first thermosetting resin is not particularly limited and may be appropriately selected depending on the purpose. Examples thereof include thermosetting epoxy resins such as bisphenol A type epoxy resins, bisphenol F type epoxy resins, novolac type epoxy resins and modified epoxy resins thereof. These may be used individually or in combination.

<<<Conductive Microparticles>>>

The conductive microparticles are not particularly limited and may be metal particles or metal-coated resin particles having a particle diameter of 1 μm to 50 μm, each particle having the same composition as particles used in conventional anisotropic adhesives.

Examples of the metal particles include nickel particles, cobalt particles and copper particles. For preventing surface oxidization of the particles, their surfaces may be coated with gold or palladium. Further, the surfaces of the particles may be provided with an insulative film using metal protrusions and/or organic compounds.

Examples of the metal-coated resin particles include perfectly spherical particles plated by one or more metals such as nickel, cobalt and copper. Similarly, the outermost surfaces of the particles may be coated with gold or palladium. Further, the surfaces thereof may be provided with an insulative film using metal protrusions and/or organic compounds <<Second Layer>>

The second layer is not particularly limited, so long as it is located at the second circuit member side, and contains a radical curing agent and a second thermosetting resin, and may be appropriately selected depending on the purpose. The second layer may further contain conductive particles.

<<<Radical Curing Agent>>>

The radical curing agent is not particularly limited and may be appropriately selected depending on the purpose. Examples thereof include organic peroxides.

<<<Second Thermosetting Resin>>>

The second thermosetting resin is not particularly limited and may be appropriately selected depending on the purpose. Examples thereof include acrylic resins such as methyl(meth)acrylate, ethyl(meth)acrylate, isopropyl(meth)acrylate, isobutyl(meth)acrylate, epoxy(meth)acrylate, ethylene glycol di(meth)acrylate, diethylene glycol di(meth)acrylate, trimethylolpropane tri(meth)acrylate, dimethyloltricyclodecane di(meth)acrylate, tetramethyleneglycol tetra(meth)acrylate, 2-hydroxy-1,3-di(meth)acryloxypropane, 2,2-bis[4-((meth)acryloxymethoxy)phenyl]propane, 2,2-bis[4-((meth)acryloxyethoxy)phenyl]propane, dicyclopentenyl (meth)acrylate, tricyclodecanyl(meth)acrylate, tris((meth)acryloxyethyl)isocyanurate and urethane (meth)acrylate. These may be used individually or in combination.

<<Difference in Maximum Exothermic Peak Temperature Between First and Second Layers>>

The difference in maximum exothermic peak temperature between the first and second layers is within the range up to 20° C. In recent years, the amount of LCD panels produced increases, and the connection of circuit members is performed for 10 sec or shorter as a result of reduction of the tact time. In the case where the connection is performed by heat for a short time, when the first and second layers have different reaction rates, one of the layers is cured faster than the other, resulting in that the circuit member cannot be satisfactorily pressed thereinto.

<<Other Layer>>

The other layers are not particularly limited and may be appropriately selected depending on the purpose. Examples thereof include a release layer.

The shape, structure, size, thickness, material, etc. of the release layer are not particularly limited and may be appropriately selected depending on the purpose. Preferably, it has excellent releasibility or high heat resistance. Preferred examples thereof include transparent release polyethylene terephthalate (PET) sheet on which a releasing agent (e.g., silicone) has been applied. Also, a polytetrafluoroethylene (PTFE) sheet may be used.

<Other Members>

The other members are not particularly limited and may be appropriately selected depending on the purpose.

(Method for Producing Joined Structure)

A method for producing the joined structure of the present invention includes a joining step; and, if necessary, further includes an appropriately selected other step.

<Joining Step>

The joining step is a step of pressure-bonding first and second circuit members together via the anisotropic conductive film of the present invention while the circuit members are being heated, thereby joining the circuit members with each other.

The heating is determined by the total amount of heat. When the joining is completed by connecting the circuit members with each other for 10 sec or shorter, the heating is performed at a heating temperature of 120° C. to 220° C.

The pressure-bonding is performed in consideration of the type of the second circuit member. In the case of a TAB tape, the pressure-bonding is performed at a pressure of 2 MPa to 6 MPa, and in the case of an IC chip, the pressure-bonding is performed at a pressure of 20 MPa to 120 MPa. In either case, the pressure-bonding is performed for 3 sec to 10 sec.

Notably, the joining may be performed through ultrasonication and heating.

<Other Steps>

The other steps are not particularly limited and may be appropriately selected depending on the purpose.

EXAMPLES

The present invention will next be described by way of examples, which should not be construed as limiting the present invention thereto.

Production Example 1

Cationic-curable Electrode-adhering Sheet C1

Conductive particles (product name: AUL704, product of SEKISUI CHEMICAL CO., LTD.) were dispersed in an adhesive so that the density of particles was adjusted to 50,000/mm$^2$, the adhesive containing 60 parts of a phenoxy resin (product name: YP-50, product of Tohto Kasei Co., Ltd.), 35 parts of an epoxy resin (product name: EP-828, product of Japan Epoxy Resins Co., Ltd.), 1 part of a silane coupling agent (product name: KBM-403, product of Shin-Etsu Chemical Co., Ltd.) and 4 parts of a curing agent (product name: SI-60L, product of SANSHIN CHEMICAL INDUSTRY CO., LTD.). The resultant dispersion was used to form 20 μm-thick cationic-curable electrode-adhering sheet C1.

Figure 3:
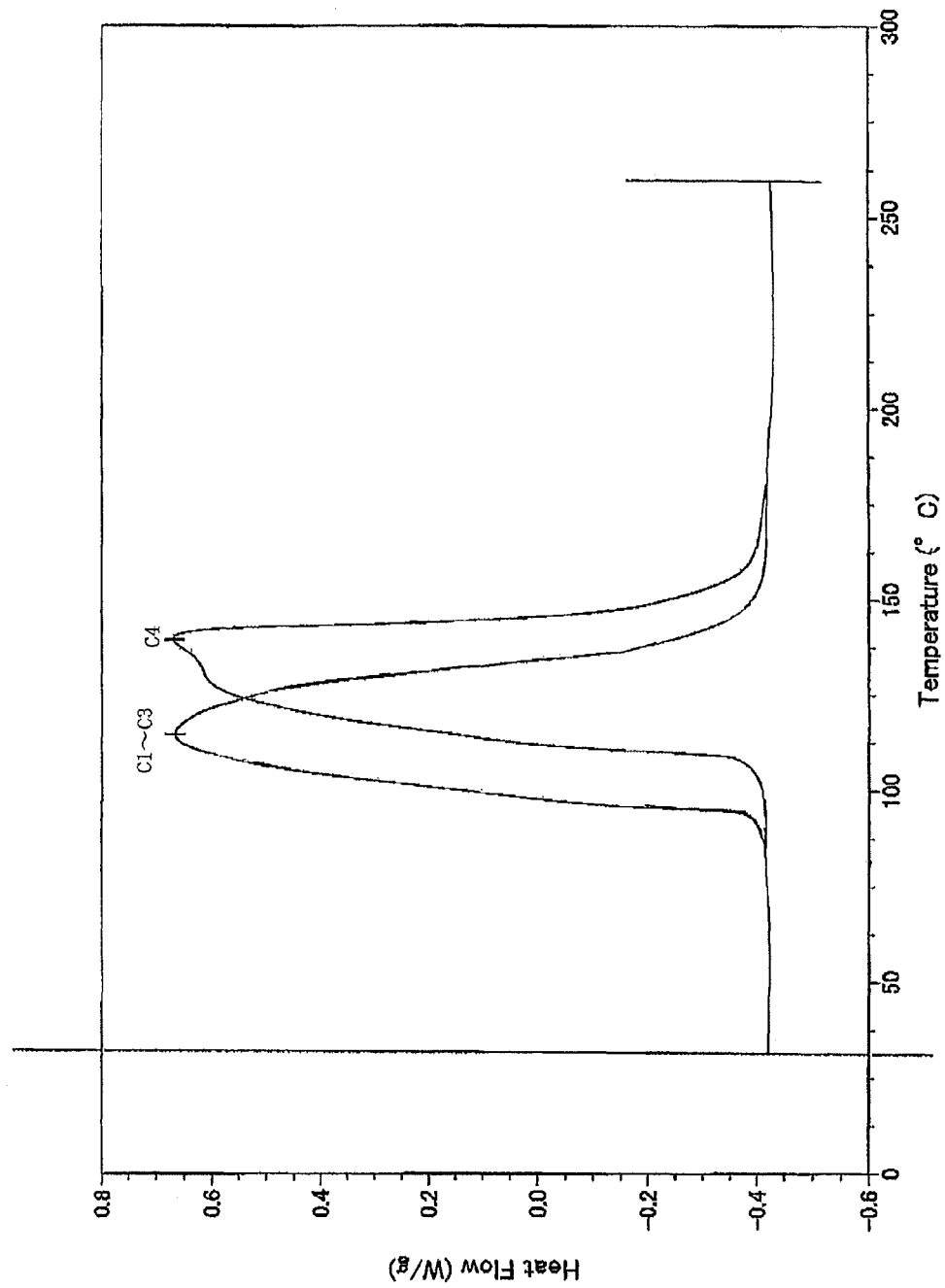
FIG. 3 shows DSC data of cationic-curable electrode-adhering sheets C1 to C4 used in Examples.

The thus-formed sheet was measured for maximum exothermic peak temperature with a DSC meter (product name: EXSTAR6000, product of Seico Instruments Inc.). The results are shown in Table 1 and FIG. 3. The DSC measurement was performed under a stream of nitrogen with the temperature being increased from room temperature at a rate of 10° C./min.

Production Example 2

Cationic-curable Electrode-adhering Sheet C2

The procedure of Production Example 1 was repeated, except that the thickness was changed from 20 μm to 10 to thereby form cationic-curable electrode-adhering sheet C2.

The thus-formed sheet was measured for maximum exothermic peak temperature with a DSC meter (product name: EXSTAR6000, product of Seico Instruments Inc.). The results are shown in Table 1 and FIG. 3.

Production Example 3

Cationic-curable Electrode-adhering Sheet C3

The procedure of Production Example 2 was repeated, except that the conductive particles (product name: AUL704, product of SEKISUI CHEMICAL CO., LTD.) were not added, to thereby form cationic-curable electrode-adhering sheet C3.

The thus-formed sheet was measured for maximum exothermic peak temperature with a DSC meter (product name: EXSTAR6000, product of Seico Instruments Inc.). The results are shown in Table 1 and FIG. 3.

Production Example 4

Cationic-curable Electrode-adhering Sheet C4

The procedure of Production Example 2 was repeated, except that the curing agent (product name: SI-60L, SANSHIN CHEMICAL INDUSTRY CO., LTD.) was changed to a curing agent (product name: SI-80L, SANSHIN CHEMICAL INDUSTRY CO., LTD.), to thereby form cationic-curable electrode-adhering sheet C4.

The thus-formed sheet was measured for maximum exothermic peak temperature with a DSC meter (product name: EXSTAR6000, product of Seico Instruments Inc.). The results are shown in Table 1 and FIG. 3.

Production Example 5

Radical-curable Electrode-adhering Sheet R1

Conductive particles (product name: AUL704, product of SEKISUI CHEMICAL CO., LTD.) were dispersed in an adhesive so that the density of particles was adjusted to 50,000/mm$^2$, the adhesive containing 60 parts of a phenoxy resin (product name: YP-50, product of Tohto Kasei Co., Ltd.), 35 parts of a radical-polymerizable resin (product name: EB-600, product of DYCEL-CYTEC COMPANY LTD.), 1 part of a silane coupling agent (product name: KBM-503, product of Shin-Etsu Chemical Co., Ltd.) and 2 parts of a curing agent (product name: PERBUTYL O, product of NOF Corporation). The resultant dispersion was used to form 20 μm-thick radical-curable electrode-adhering sheet R1.

Figure 4:
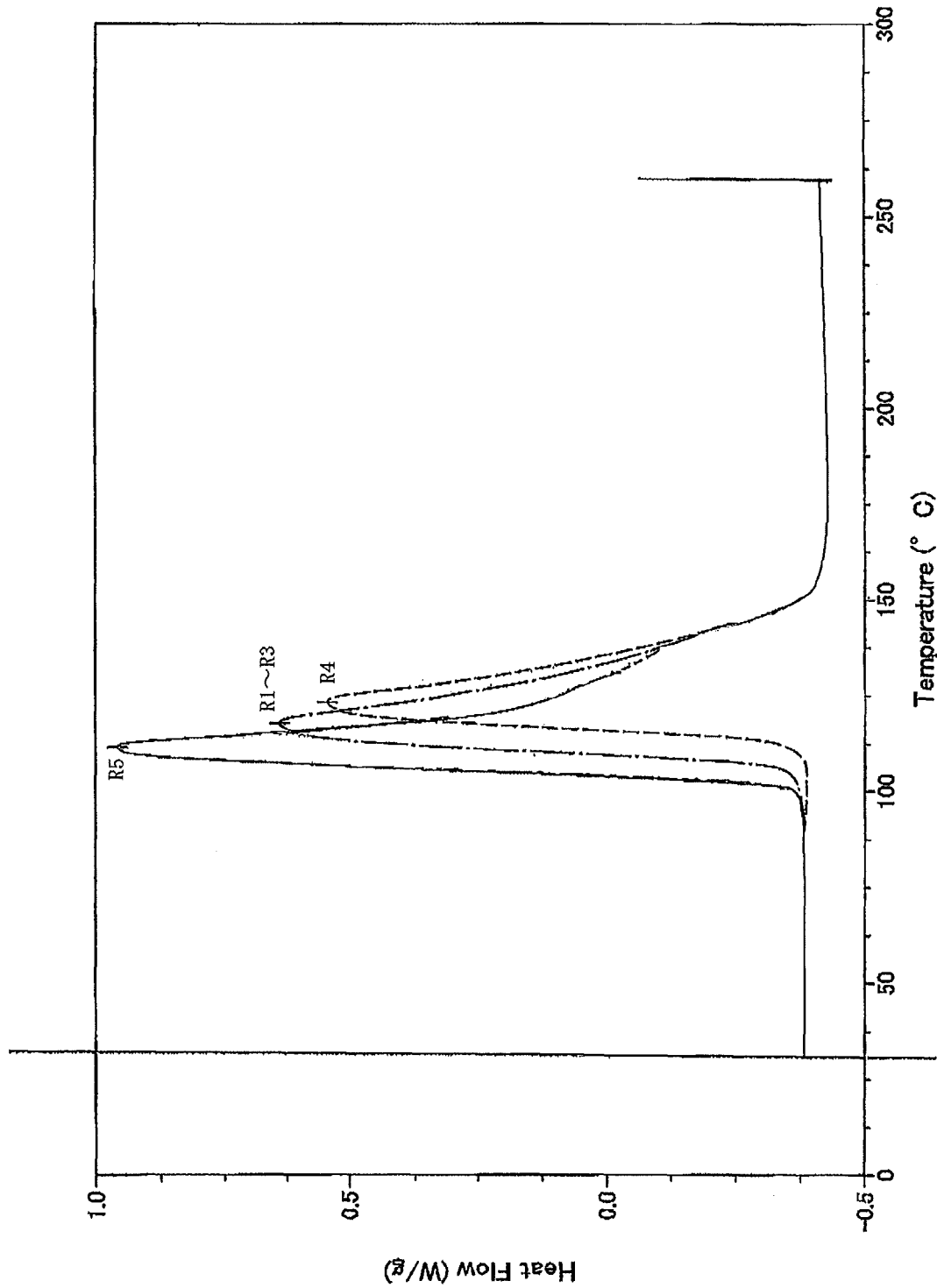
FIG. 4 shows DSC data of radical-curable electrode-adhering sheets R1 to R5 used in Examples.

The thus-formed sheet was measured for maximum exothermic peak temperature with a DSC meter (product name: EXSTAR6000, product of Seico Instruments Inc.). The results are shown in Table 1 and FIG. 4.

Production Example 6

Radical-curable Electrode-adhering Sheet R2

The procedure of Production Example 5 was repeated, except that the thickness was changed from 20 μm to 10 μm, to thereby form radical-curable electrode-adhering sheet R2.

The thus-formed sheet was measured for maximum exothermic peak temperature with a DSC meter (product name: EXSTAR6000, product of Seico Instruments Inc.). The results are shown in Table 1 and FIG. 4.

Production Example 7

Radical-curable Electrode-adhering Sheet R3

The procedure of Production Example 6 was repeated, except that the conductive particles (product name: AUL704, product of SEKISUI CHEMICAL CO., LTD.) were not added, to thereby form radical-curable electrode-adhering sheet R3.

The thus-formed sheet was measured for maximum exothermic peak temperature with a DSC meter (product name: EXSTAR6000, product of Seico Instruments Inc.). The results are shown in Table 1 and FIG. 4.

Production Example 8

Radical-curable Electrode-Adhering Sheet R4

The procedure of Production Example 7 was repeated, except that the amount of the curing agent (product name: PERBUTYL O, product of NOF Corporation) was changed from 2 parts to 0.5 parts, to thereby form radical-curable electrode-adhering sheet R4.

The thus-formed sheet was measured for maximum exothermic peak temperature with a DSC meter (product name:

EXSTAR6000, product of Seico Instruments Inc.). The results are shown in Table 1 and FIG. 4.

Production Example 9

Radical-curable Electrode-adhering Sheet R5

The procedure of Production Example 7 was repeated, except that the amount of the curing agent (product name: PERBUTYL O, product of NOF Corporation) was changed from 2 parts to 6 parts, to thereby form radical-curable electrode-adhering sheet R5.

The thus-formed sheet was measured for maximum exothermic peak temperature with a DSC meter (product name: EXSTAR6000, product of Seico Instruments Inc.). The results are shown in Table 1 and FIG. 4.

Production Example 10

Radical-curable Electrode-adhering Sheet R6

The procedure of Production Example 7 was repeated, except that the curing agent (product name: PERBUTYL O, product of NOF Corporation) was changed to a curing agent (product name: PEROYL L, product of NOF Corporation), to thereby form radical-curable electrode-adhering sheet R6.

Figure 5:
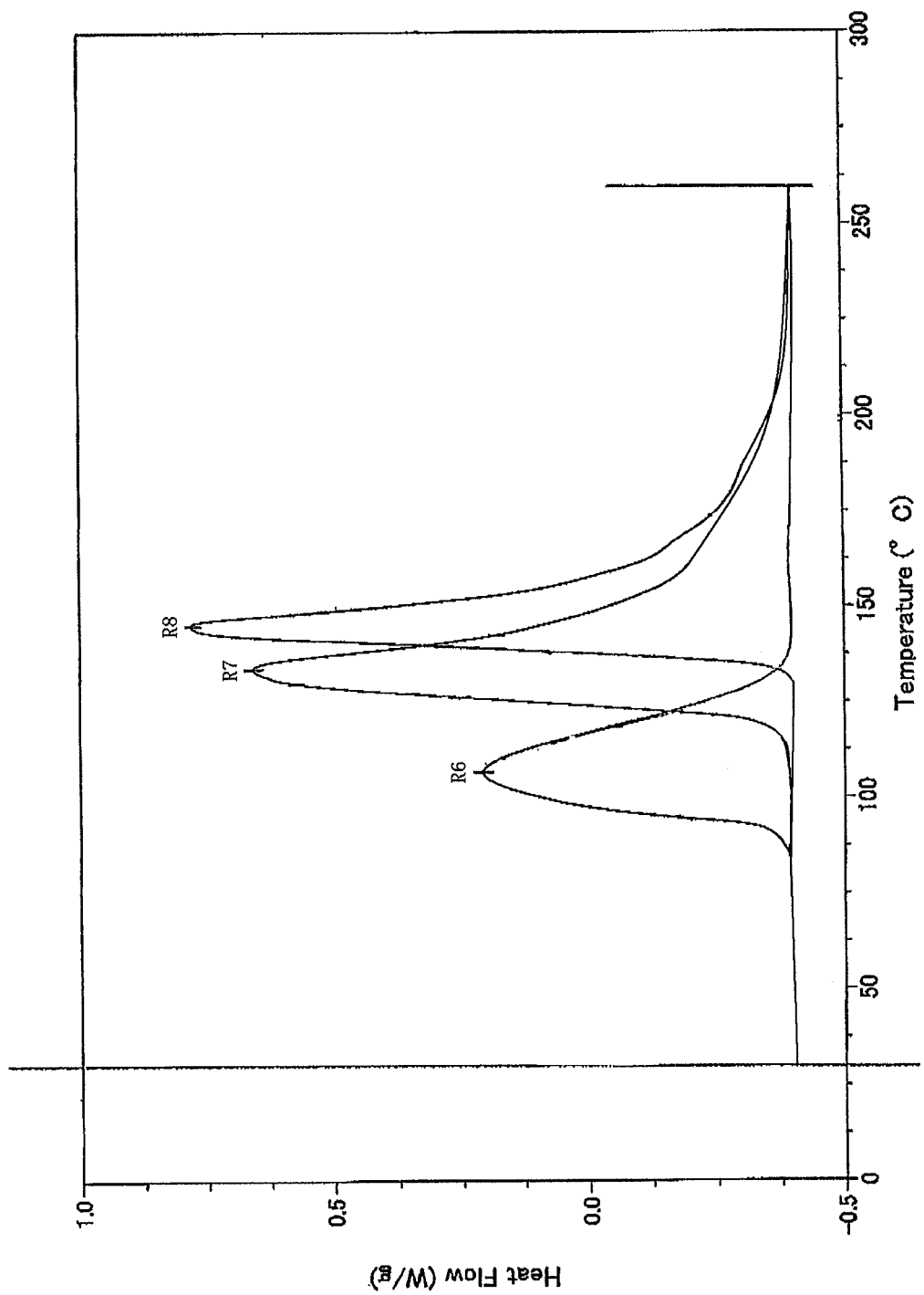
FIG. 5 shows DSC data of radical-curable electrode-adhering sheets R6 to R8 used in Examples.

The thus-formed sheet was measured for maximum exothermic peak temperature with a DSC meter (product name: EXSTAR6000, product of Seico Instruments Inc.). The results are shown in Table 1 and FIG. 5.

Production Example 11

Radical-curable Electrode-adhering Sheets R7 and R7-2

The procedure of Production Example 7 was repeated, except that the curing agent (product name: PERBUTYL O, product of NOF Corporation) was changed to a curing agent (product name: PERBUTYL E, product of NOF Corporation), to thereby form radical-curable electrode-adhering sheet R7.

Separately, the procedure of Production Example 7 was repeated, except that 2 parts of the curing agent (product name: PERBUTYL O, product of NOF Corporation) was changed to 0.5 parts of a curing agent (product name: PERBUTYL E, product of NOF Corporation), to thereby form radical-curable electrode-adhering sheet R7-2.

The thus-formed sheet was measured for maximum exothermic peak temperature with a DSC meter (product name: EXSTAR6000, product of Seico Instruments Inc.). The results are shown in Table 1 and FIG. 5.

Production Example 12

Radical-curable Electrode-adhering Sheet R8

The procedure of Production Example 7 was repeated, except that the curing agent (product name: PERBUTYL O, product of NOF Corporation) was changed to a curing agent (product name: PERCUMYL D, product of NOF Corporation), to thereby form radical-curable electrode-adhering sheet R8.

The thus-formed sheet was measured for maximum exothermic peak temperature with a DSC meter (product name: EXSTAR6000, product of Seico Instruments Inc.). The results are shown in Table 1 and FIG. 5.

TABLE 1

| | C1 to C3 | C4 | R1 to R3 | R4 | R5 | R6 | R7 | R7-2 | R8 |
|---|---|---|---|---|---|---|---|---|---|
| Peak temp. (° C.) | 114 | 138 | 118 | 123 | 111 | 106 | 133 | 139 | 145 |

Production Example 13

Photocationic-curable Electrode-adhering Sheet U1

Conductive particles (product name: AUL704, product of SEKISUI CHEMICAL CO., LTD.) were dispersed in an adhesive so that the density of particles was adjusted to 50,000/mm$^2$, the adhesive containing 60 parts of a phenoxy resin (product name: YP-50, product of Tohto Kasei Co., Ltd.), 35 parts of an epoxy resin (product name: EP-828, product of Japan Epoxy Resins Co., Ltd.), 1 part of a silane coupling agent (product name: KBM-403, product of Shin-Etsu Chemical Co., Ltd.) and 2 parts of a photocuring agent (product name: CYRACURE UVI-6990, product of Union Carbide Corporation). The resultant dispersion was used to form 20 μm-thick photocationic-curable electrode-adhering sheet U1.

Production Example 14

Photocationic-curable Electrode-adhering Sheet U2

The procedure of Production Example 13 was repeated, except that the thickness was changed from 20 μm to 10 μm, to thereby form photocationic-curable electrode-adhering sheet U2.

Comparative Example 1

IC chip A (dimension: 1.8 mm×20.0 mm, thickness: 0.5 mm, gold bump size: 30 μm×85 μm, bump height: 15 μmt, pitch: 50 μm) was connected via cationic-curable electrode-adhering sheet C1 formed in Production Example 1 with an aluminum-patterned glass substrate (product of Corning Incorporated, 1737F, size: 50 mm×30 mm×0.5 mm), the pattern of which corresponding to that of IC chip A, whereby joined structure C1-A was produced. Notably, the passivation film of IC chip A contains $Si_3N_4$. Here, the connection of IC chip A with the aluminum-patterned glass substrate was performed by driving in IC chip A for 5 sec at 190° C. and 80 MPa.

IC chip B (dimension: 1.8 mm×20.0 mm, thickness: 0.5 mm, gold bump size: 30 μm×85 μm, bump height: 15 μmt, pitch: 50 μm) was connected via cationic-curable electrode-adhering sheet C1 formed in Production Example 1 with an aluminum-patterned glass substrate (product of Corning Incorporated, 1737F, size: 50 mm×30 mm×0.5 mm), the pattern of which corresponding to that of IC chip B, whereby joined structure C1-B was produced. Notably, the passivation film of IC chip B contains polyimide. Here, the connection of IC chip B with the aluminum-patterned glass substrate was performed by driving in IC chip B for 5 sec at 190° C. and 80 MPa.

<Measurement of Connection Resistance>

The thus-produced joined structures C1-A and C1-B were measured for connection resistance using a tester (i.e., initial connection resistance and connection resistance after environmental testing (85° C./85%/500 hr)). The results of joined structure C1-A are shown in column "A type" in Table 2-1, and those of joined structure C1-B in column "B type" in Table 2-1.

<Measurement of Adhesion Strength>

The thus-produced joined structures C1-A and C1-B were measured for initial adhesion strength using a die shear tester (product name: Dage 2400, product of Dage Co.). The results of joined structure C1-A are shown in column "A type" in Table 2-1, and those of joined structure C1-B in column "B type" in Table 2-1.

<Analysis of Cross-sectional Surface>

After environmental testing (85° C./85%/500 hr), the cross-sectional surfaces of joined structures C1-A and C1-B were polished, and the connection states were confirmed. The results of joined structure C1-A are shown in column "A type" in Table 2-1, and those of joined structure C1-B in column "B type" in Table 2-1.

Comparative Example 2

The procedure of Comparative Example 1 was repeated, except that cationic-curable electrode-adhering sheet C1 was changed to electrode-adhering sheet R1 formed in Production Example 5, to thereby produce joined structures R1-A and R1-B and then subjecting the joined structures to measurements of connection resistance and adhesion strength, and analysis of cross-sectional surface. The results of joined structure R1-A are shown in column "A type" in Table 2-1, and those of joined structure R1-B in column "B type" in Table 2-1.

Comparative Example 3

The procedure of Comparative Example 1 was repeated, except that cationic-curable electrode-adhering sheet C1 was changed to two-layered electrode-adhering sheet D1, to thereby produce joined structures D1-A and D1-B and then subjecting the joined structures to measurements of connection resistance and adhesion strength, and analysis of cross-sectional surface. The results of joined structure D1-A are shown in column "A type" in Table 2-1, and those of joined structure D1-B in column "B type" in Table 2-1.

Notably, as shown in Table 3, the two-layered electrode-adhering sheet D1 had a two-layered structure of radical-curable electrode-adhering sheet R8 formed in Production Example 12 and cationic-curable electrode-adhering sheet C2 formed in Production Example 2, and was placed so that radical-curable electrode-adhering sheet R8 and cationic-curable electrode-adhering sheet C2 were attached to the IC chip and the aluminum-patterned glass substrate, respectively. Also, the difference in maximum exothermic peak temperature between these sheets is 31° C.

Example 1

The procedure of Comparative Example 1 was repeated, except that cationic-curable electrode-adhering sheet C1 was changed to two-layered electrode-adhering sheet D2, to thereby produce joined structures D2-A and D2-B and then subjecting the joined structures to measurements of connection resistance and adhesion strength, and analysis of cross-sectional surface. The results of joined structure D2-A are shown in column "A type" in Table 2-1, and those of joined structure D2-B in column "B type" in Table 2-1.

Notably, as shown in Table 3, the two-layered electrode-adhering sheet D2 had a two-layered structure of radical-curable electrode-adhering sheet R7 formed in Production Example 11 and cationic-curable electrode-adhering sheet C2 formed in Production Example 2, and was placed so that radical-curable electrode-adhering sheet R7 and cationic-curable electrode-adhering sheet C2 were attached to the IC chip and the aluminum-patterned glass substrate, respectively. Also, the difference in maximum exothermic peak temperature between these sheets is 19° C.

Example 2

The procedure of Comparative Example 1 was repeated, except that cationic-curable electrode-adhering sheet C1 was changed to two-layered electrode-adhering sheet D3, to thereby produce joined structures D3-A and D3-B and then subjecting the joined structures to measurements of connection resistance and adhesion strength, and analysis of cross-sectional surface. The results of joined structure D3-A are shown in column "A type" in Table 2-1, and those of joined structure D3-B in column "B type" in Table 2-1.

Notably, as shown in Table 3, the two-layered electrode-adhering sheet D3 had a two-layered structure of radical-curable electrode-adhering sheet R3 formed in Production Example 7 and cationic-curable electrode-adhering sheet C2 formed in Production Example 2, and was placed so that radical-curable electrode-adhering sheet R3 and cationic-curable electrode-adhering sheet C2 were attached to the IC chip and the aluminum-patterned glass substrate, respectively. Also, the difference in maximum exothermic peak temperature between these sheets is 4° C.

Example 3

The procedure of Comparative Example 1 was repeated, except that cationic-curable electrode-adhering sheet C1 was changed to two-layered electrode-adhering sheet D4, to thereby produce joined structures D4-A and D4-B and then subjecting the joined structures to measurements of connection resistance and adhesion strength, and analysis of cross-sectional surface. The results of joined structure D4-A are shown in column "A type" in Table 2-1, and those of joined structure D4-B in column "B type" in Table 2-1.

Notably, as shown in Table 3, the two-layered electrode-adhering sheet D4 had a two-layered structure of radical-curable electrode-adhering sheet R7 formed in Production Example 11 and cationic-curable electrode-adhering sheet C4 formed in Production Example 4, and was placed so that radical-curable electrode-adhering sheet R7 and cationic-curable electrode-adhering sheet C4 were attached to the IC chip and the aluminum-patterned glass substrate, respectively. Also, the difference in maximum exothermic peak temperature between these sheets is 5° C.

Example 4

The procedure of Comparative Example 1 was repeated, except that cationic-curable electrode-adhering sheet C1 was changed to two-layered electrode-adhering sheet D5, to thereby produce joined structures D5-A and D5-B and then subjecting the joined structures to measurements of connection resistance and adhesion strength, and analysis of cross-sectional surface. The results of joined structure D5-A are shown in column "A type" in Table 2-1, and those of joined structure D5-B in column "B type" in Table 2-1.

Notably, as shown in Table 3, the two-layered electrode-adhering sheet D5 had a two-layered structure of radical-curable electrode-adhering sheet R3 formed in Production Example 7 and cationic-curable electrode-adhering sheet C4 formed in Production Example 4, and was placed so that radical-curable electrode-adhering sheet R3 and cationic-curable electrode-adhering sheet C4 were attached to the IC chip and the aluminum-patterned glass substrate, respectively.

Also, the difference in maximum exothermic peak temperature between these sheets is 20° C.

Comparative Example 4

The procedure of Comparative Example 1 was repeated, except that cationic-curable electrode-adhering sheet C1 was changed to two-layered electrode-adhering sheet D6, to thereby produce joined structures D6-A and D6-B and then subjecting the joined structures to measurements of connection resistance and adhesion strength, and analysis of cross-sectional surface. The results of joined structure D6-A are shown in column "A type" in Table 2-1, and those of joined structure D6-B in column "B type" in Table 2-1.

Notably, as shown in Table 3, the two-layered electrode-adhering sheet D6 had a two-layered structure of radical-curable electrode-adhering sheet R6 formed in Production Example 10 and cationic-curable electrode-adhering sheet C4 formed in Production Example 4, and was placed so that radical-curable electrode-adhering sheet R6 and cationic-curable electrode-adhering sheet C4 were attached to the IC chip and the aluminum-patterned glass substrate, respectively. Also, the difference in maximum exothermic peak temperature between these sheets is 32° C.

Comparative Example 5

The procedure of Comparative Example 1 was repeated, except that cationic-curable electrode-adhering sheet C1 was changed to two-layered electrode-adhering sheet D7, to thereby produce joined structures D7-A and D7-B and then subjecting the joined structures to measurements of connection resistance and adhesion strength, and analysis of cross-sectional surface. The results of joined structure D7-A are shown in column "A type" in Table 2-1, and those of joined structure D7-B in column "B type" in Table 2-1.

Notably, as shown in Table 3, the two-layered electrode-adhering sheet D7 had a two-layered structure of radical-curable electrode-adhering sheet R7-2 formed in Production Example 11 and cationic-curable electrode-adhering sheet C2 formed in Production Example 2, and was placed so that radical-curable electrode-adhering sheet R7-2 and cationic-curable electrode-adhering sheet C2 were attached to the IC chip and the aluminum-patterned glass substrate, respectively. Also, the difference in maximum exothermic peak temperature between these sheets is 25° C.

Example 5

The procedure of Comparative Example 1 was repeated, except that cationic-curable electrode-adhering sheet C1 was changed to two-layered electrode-adhering sheet D8, to thereby produce joined structures D8-A and D8-B and then subjecting the joined structures to measurements of connection resistance and adhesion strength, and analysis of cross-sectional surface. The results of joined structure D8-A are shown in column "A type" in Table 2-1, and those of joined structure D8-B in column "B type" in Table 2-1.

Notably, as shown in Table 3, the two-layered electrode-adhering sheet D8 had a two-layered structure of radical-curable electrode-adhering sheet R4 formed in Production Example 8 and cationic-curable electrode-adhering sheet C2 formed in Production Example 2, and was placed so that radical-curable electrode-adhering sheet R4 and cationic-curable electrode-adhering sheet C2 were attached to the IC chip and the aluminum-patterned glass substrate, respectively. Also, the difference in maximum exothermic peak temperature between these sheets is 9° C.

Example 6

The procedure of Comparative Example 1 was repeated, except that cationic-curable electrode-adhering sheet C1 was changed to two-layered electrode-adhering sheet D9, to thereby produce joined structures D9-A and D9-B and then subjecting the joined structures to measurements of connection resistance and adhesion strength, and analysis of cross-sectional surface. The results of joined structure D9-A are shown in column "A type" in Table 2-2, and those of joined structure D9-B in column "B type" in Table 2-2.

Notably, as shown in Table 3, the two-layered electrode-adhering sheet D9 had a two-layered structure of radical-curable electrode-adhering sheet R4 formed in Production Example 8 and cationic-curable electrode-adhering sheet C4 formed in Production Example 4, and was placed so that radical-curable electrode-adhering sheet R4 and cationic-curable electrode-adhering sheet C4 were attached to the IC chip and the aluminum-patterned glass substrate, respectively. Also, the difference in maximum exothermic peak temperature between these sheets is 15° C.

Comparative Example 6

The procedure of Comparative Example 1 was repeated, except that cationic-curable electrode-adhering sheet C1 was changed to two-layered electrode-adhering sheet D10, to thereby produce joined structures D10-A and D1O-B and then subjecting the joined structures to measurements of connection resistance and adhesion strength, and analysis of cross-sectional surface. The results of joined structure D10-A are shown in column "A type" in Table 2-2, and those of joined structure D1O-B in column "B type" in Table 2-2.

Notably, as shown in Table 3, the two-layered electrode-adhering sheet D10 had a two-layered structure of radical-curable electrode-adhering sheet R5 formed in Production Example 9 and cationic-curable electrode-adhering sheet C4 formed in Production Example 4, and was placed so that radical-curable electrode-adhering sheet R5 and cationic-curable electrode-adhering sheet C4 were attached to the IC chip and the aluminum-patterned glass substrate, respectively. Also, the difference in maximum exothermic peak temperature between these sheets is 27° C.

Example 7

The procedure of Comparative Example 1 was repeated, except that cationic-curable electrode-adhering sheet C1 was changed to two-layered electrode-adhering sheet D11, to thereby produce joined structures D11-A and D11-B and then subjecting the joined structures to measurements of connection resistance and adhesion strength, and analysis of cross-sectional surface. The results of joined structure D11-A are shown in column "A type" in Table 2-2, and those of joined structure D11-B in column "B type" in Table 2-2.

Notably, as shown in Table 3, the two-layered electrode-adhering sheet D11 had a two-layered structure of radical-curable electrode-adhering sheet R2 formed in Production Example 6 and cationic-curable electrode-adhering sheet C2 formed in Production Example 2, and was placed so that radical-curable electrode-adhering sheet R2 and cationic-curable electrode-adhering sheet C2 were attached to the IC chip and the aluminum-patterned glass substrate, respectively. Also, the difference in maximum exothermic peak temperature between these sheets is 4° C. Further, conductive particles are incorporated into both the sheet attached to the IC chip and the sheet attached to the aluminum-patterned glass substrate (i.e., both radical-curable electrode-adhering sheet R2 and cationic-curable electrode-adhering sheet C2).

Example 8

The procedure of Comparative Example 1 was repeated, except that cationic-curable electrode-adhering sheet C1 was changed to two-layered electrode-adhering sheet D12, to thereby produce joined structures D12-A and D12-B and then subjecting the joined structures to measurements of connection resistance and adhesion strength, and analysis of cross-sectional surface. The results of joined structure D12-A are shown in column "A type" in Table 2-2, and those of joined structure D12-B in column "B type" in Table 2-2.

Notably, as shown in Table 3, the two-layered electrode-adhering sheet D12 had a two-layered structure of radical-curable electrode-adhering sheet R2 formed in Production Example 6 and cationic-curable electrode-adhering sheet C3 formed in Production Example 3, and was placed so that radical-curable electrode-adhering sheet R2 and cationic-curable electrode-adhering sheet C3 were attached to the IC chip and the aluminum-patterned glass substrate, respectively. Also, the difference in maximum exothermic peak temperature between these sheets is 4° C. Further, conductive particles are incorporated into the sheet attached to the IC chip (i.e., radical-curable electrode-adhering sheet R2).

Comparative Example 7

The procedure of Comparative Example 1 was repeated, except that cationic-curable electrode-adhering sheet C1 was changed to two-layered electrode-adhering sheet D13, to thereby produce joined structures D13-A and D13-B and then subjecting the joined structures to measurements of connection resistance and adhesion strength, and analysis of cross-sectional surface. The results of joined structure D13-A are shown in column "A type" in Table 2-2, and those of joined structure D13-B in column "B type" in Table 2-2.

Notably, as shown in Table 3, the two-layered electrode-adhering sheet D13 had a two-layered structure of radical-curable electrode-adhering sheet R2 formed in Production Example 6 and cationic-curable electrode-adhering sheet C3 formed in Production Example 2, and was placed so that cationic-curable electrode-adhering sheet C3 and radical-curable electrode-adhering sheet R2 were attached to the IC chip and the aluminum-patterned glass substrate, respectively (i.e., these sheets oppositely attached unlike the above). Also, the difference in maximum exothermic peak temperature between these sheets is 4° C.

Comparative Example 8

The procedure of Comparative Example 1 was repeated, except that cationic-curable electrode-adhering sheet C1 was changed to photocationic-curable electrode-adhering sheet U1 formed in Production Example 13, to thereby produce joined structures U1-A and U1-B and then subjecting the joined structures to measurements of connection resistance and adhesion strength, and analysis of cross-sectional surface. The results of joined structure U1-A are shown in column "A type" in Table 2-2, and those of joined structure U1-B in column "B type" in Table 2-2.

Comparative Example 9

The procedure of Comparative Example 1 was repeated, except that cationic-curable electrode-adhering sheet C1 was changed to two-layered electrode-adhering sheet D14, and that the connection of an IC chip with an aluminum-patterned glass substrate was performed by "driving in the IC chip for 3 sec at 130° C. and 80 MPa and then irradiating the resultant product with LTV rays (using a metal halide lamp, light quantity: 3,000 mJ/cm$^2$) for 20 sec from the side of the aluminum-patterned glass substrate" rather than "driving in the IC chip for 5 sec at 190° C. and 80 MPa," to thereby produce joined structures D14-A and D14-B and then subjecting the joined structures to measurements of connection resistance and adhesion strength, and analysis of cross-sectional surface. The results of joined structure D14-A are shown in column "A type" in Table 2-2, and those of joined structure D14-B in column "B type" in Table 2-2.

Notably, as shown in Table 3, the two-layered electrode-adhering sheet D14 had a two-layered structure of radical-curable electrode-adhering sheet R3 formed in Production Example 7 and photocationic-curable electrode-adhering sheet U2 formed in Production Example 14, and was placed so that radical-curable electrode-adhering sheet R3 and photocationic-curable electrode-adhering sheet U2 were attached to the IC chip and the aluminum-patterned glass substrate, respectively.

Comparative Example 10

The procedure of Comparative Example 1 was repeated, except that cationic-curable electrode-adhering sheet C1 was changed to two-layered electrode-adhering sheet D15, and that the connection of an IC chip with an aluminum-patterned glass substrate was performed by "driving in the IC chip for 3 sec at 130° C. and 80 MPa and then irradiating the resultant product with LTV rays (using a metal halide lamp, light quantity: 3,000 mJ/cm$^2$) for 20 sec from the side of the aluminum-patterned glass substrate" rather than "driving in the IC chip for 5 sec at 190° C. and 80 MPa," to thereby produce joined structures D15-A and D15-B and then subjecting the joined structures to measurements of connection resistance and adhesion strength, and analysis of cross-sectional surface. The results of joined structure D15-A are shown in column "A type" in Table 2-2, and those of joined structure D15-B in column "B type" in Table 2-2.

Notably, as shown in Table 3, the two-layered electrode-adhering sheet D15 had a two-layered structure of radical-curable electrode-adhering sheet R8 formed in Production Example 12 and photocationic-curable electrode-adhering sheet U2 formed in Production Example 14, and was placed so that radical-curable electrode-adhering sheet R8 and photocationic-curable electrode-adhering sheet U2 were attached to the IC chip and the aluminum-patterned glass substrate, respectively.

TABLE 2-1

| | | A type | | | | B type | | | |
|---|---|---|---|---|---|---|---|---|---|
| | | Connection resistance [Ω] | | Adhesion | | Connection resistance [Ω] | | Adhesion | |
| | ACF | Initial | 85° C./85%/ 500 hr | strength [N/IC] | Analysis of cross-sectional surface | Initial | 85° C./85%/ 500 hr | strength [N/IC] | Analysis of cross-sectional surface |
| Comp. Ex. 1 | C1 | 0.5 | 3.4 | >50 | Normal | 2.1 | 33.9 | 18 | Peeled off from passivation film |
| Comp. Ex. 2 | R1 | 0.5 | 20.4 | >50 | Peeled off from glass substrate | 0.5 | 22.3 | >50 | Peeled off from glass substrate |

TABLE 2-1-continued

| | | A type | | | | B type | | | |
|---|---|---|---|---|---|---|---|---|---|
| | | Connection resistance [Ω] | | Adhesion | | Connection resistance [Ω] | | Adhesion | |
| | ACF | Initial | 85° C./85%/ 500 hr | strength [N/IC] | Analysis of cross-sectional surface | Initial | 85° C./85%/ 500 hr | strength [N/IC] | Analysis of cross-sectional surface |
| Comp. Ex. 3 | D1 | 1.9 | 24.9 | >50 | Conductive particles not in contact with terminals | 2.2 | 26.1 | >50 | Conductive particles not in contact with terminals |
| Ex. 1 | D2 | 0.5 | 3.6 | >50 | Normal | 0.5 | 3.6 | >50 | Normal |
| Ex. 2 | D3 | 0.5 | 3.4 | >50 | Normal | 0.5 | 3.4 | >50 | Normal |
| Ex. 3 | D4 | 0.5 | 3.4 | >50 | Normal | 0.5 | 3.4 | >50 | Normal |
| Ex. 4 | D5 | 0.6 | 4.0 | >50 | Normal | 0.7 | 4.1 | >50 | Normal |
| Comp. Ex. 4 | D6 | 1.8 | 23.4 | >50 | Conductive particles not in contact with terminals | 1.9 | 36.7 | >50 | Conductive particles not in contact with terminals |
| Comp. Ex. 5 | D7 | 2.3 | 40.3 | >50 | Conductive particles not in contact with terminals | 2.4 | 39.1 | >50 | Conductive particles not in contact with terminals |
| Ex. 5 | D8 | 0.5 | 3.4 | >50 | Normal | 0.5 | 3.4 | >50 | Normal |

TABLE 2-2

| | | A type | | | | B type | | | |
|---|---|---|---|---|---|---|---|---|---|
| | | Connection resistance [Ω] | | Adhesion | | Connection resistance [Ω] | | Adhesion | |
| | ACF | Initial | 85° C./85%/ 500 hr | strength [N/IC] | Analysis of cross-sectional surface | Initial | 85° C./85%/ 500 hr | strength [N/IC] | Analysis of cross-sectional surface |
| Ex. 6 | D9 | 0.5 | 3.5 | >50 | Normal | 0.5 | 3.4 | >50 | Normal |
| Comp. Ex. 6 | D10 | 2.0 | 24.3 | >50 | Conductive particles not in contact with terminals | 2.0 | 25.3 | >50 | Conductive particles not in contact with terminals |
| Ex. 7 | D11 | 0.5 | 3.4 | >50 | Normal | 0.5 | 3.4 | >50 | Normal |
| Ex. 8 | D12 | 0.5 | 3.4 | >50 | Normal | 0.5 | 3.4 | >50 | Normal |
| Comp. Ex. 7 | D13 | 2.0 | 20.1 | >50 | Peeled off from glass substrate | 2.0 | 23.3 | 19 | Peeled off from both passivation film and glass substrate |
| Comp. Ex. 8 | U1 | 2.2 | 45.3 | 16 | Interstices around conductive particles | 2.2 | 49.3 | 15 | Interstices around conductive particles |
| Comp. Ex. 9 | D14 | 1.9 | 25.7 | 21 | Interstices around conductive particles | 2.0 | 24.6 | 19 | Interstices around conductive particles |
| Comp. Ex. 10 | D15 | 1.9 | 31.3 | 24 | Interstices around conductive particles | 2.0 | 27.6 | 20 | Interstices around conductive particles |

TABLE 3

| ACF | Surface to which sheet was attached | Structure | Curing agent | Parts | Presence or absence of conductive particles | Maximum exothermic peak temp. | Difference in peak temp. |
|---|---|---|---|---|---|---|---|
| D1 | IC | R8 | PERCUMYL D | 2 | — | 145 | 31 |
| | Glass | C2 | SI-60L | 4 | Presence | 114 | |
| D2 | IC | R7 | PERBUTYL E | 2 | — | 133 | 19 |
| | Glass | C2 | SI-60L | 4 | Presence | 114 | |
| D3 | IC | R3 | PERBUTYL O | 2 | — | 118 | 4 |
| | Glass | C2 | SI-60L | 4 | Presence | 114 | |
| D4 | IC | R7 | PERBUTYL E | 2 | — | 133 | 5 |
| | Glass | C4 | SI-80L | 4 | Presence | 138 | |
| D5 | IC | R3 | PERBUTYL O | 2 | — | 118 | 20 |
| | Glass | C4 | SI-80L | 4 | Presence | 138 | |
| D6 | IC | R6 | PEROYL L | 2 | — | 106 | 32 |
| | Glass | C4 | SI-80L | 4 | Presence | 138 | |
| D7 | IC | R7-2 | PERBUTYL E | 0.5 | — | 139 | 25 |
| | Glass | C2 | SI-60L | 4 | Presence | 114 | |
| D8 | IC | R4 | PERBUTYL O | 0.5 | — | 123 | 9 |
| | Glass | C2 | SI-60L | 4 | Presence | 114 | |
| D9 | IC | R4 | PERBUTYL O | 0.5 | — | 123 | 15 |
| | Glass | C4 | SI-80L | 4 | Presence | 138 | |
| D10 | IC | R5 | PERBUTYL O | 6 | — | 111 | 27 |
| | Glass | C4 | SI-80L | 4 | Presence | 138 | |
| D11 | IC | R2 | PERBUTYL O | 2 | Presence | 118 | 4 |
| | Glass | C2 | SI-60L | 4 | Presence | 114 | |

TABLE 3-continued

| ACF | Surface to which sheet was attached | Structure | Curing agent | Parts | Presence or absence of conductive particles | Maximum exothermic peak temp. | Difference in peak temp. |
|---|---|---|---|---|---|---|---|
| D12 | IC | R2 | PERBUTYL O | 2 | Presence | 118 | 4 |
|  | Glass | C3 | SI-60L | 4 | — | 114 |  |
| D13 | IC | C3 | SI-60L | 4 | — | 114 | 4 |
|  | Glass | R2 | PERBUTYL O | 2 | Presence | 118 |  |
| D14 | IC | R3 | PERBUTYL O | 2 | — | 118 | — |
|  | Glass | U2 | CYRACURE | 2 | Presence | — |  |
| D15 | IC | R8 | PERCUMYL D | 2 | — | 145 | — |
|  | Glass | U2 | CYRACURE | 2 | Presence | — |  |

As shown in Tables 2-1 and 2-2, the joined structures of Examples 1 to 8 each contain an anisotropic conductive film composed of a radical-curable electrode-adhering sheet located at the IC chip side and a cationic-curable electrode-adhering sheet located at the aluminum-patterned glass substrate side, the difference in maximum exothermic peak temperature between the sheets being within the range up to 20° C., and thus were found to achieve high conduction reliability, since the anisotropic conductive film exhibited improved adhesion strength to the IC chip and the aluminum-patterned glass substrate.

In contrast, as shown in Table 2-1, the joined structure of Comparative Example 1 contains a single-layered anisotropic conductive film composed of a cationic-curable electrode-adhering sheet and thus, the anisotropic conductive film was found to be peeled off, since it was not able to maintain sufficient connection strength with the IC chip B (containing a passivation film of polyimide).

Also, as shown in Table 2-1, the joined structure of Comparative Example 2 contains a single-layered anisotropic conductive film composed of a radical-curable electrode-adhering sheet and thus, the anisotropic conductive film was found to be peeled off, since it was not able to maintain sufficient connection strength with the aluminum-patterned glass substrate (in particular, to glass substrate surfaces having no aluminum patterns).

Also, as shown in Tables 2-1 and 2-2, the joined structures of Comparative Examples 4 and 6 each contain an anisotropic conductive film composed of a cationic-curable electrode-adhering sheet and a radical-curable electrode-adhering sheet, the difference of which being more than 20° C. in maximum exothermic peak temperature measured through DSC measurement. Thus, the resin located at the IC chip side was cured before the IC chip was pressed thereinto, and it was found that the terminals were not in contact with the conductive particles and high conduction reliability cannot be achieved. Also, the joined structures of Comparative Examples 3 and 5 each contain an anisotropic conductive film composed of a cationic-curable electrode-adhering sheet and a radical-curable electrode-adhering sheet, the difference of which being more than 20° C. in maximum exothermic peak temperature measured through DSC measurement and thus, were found not to achieve high conduction reliability. This is because the terminals were not in contact with the conductive particles, and the resin located at the IC chip side was uncured not to obtain sufficient cohesive force, although the resin located at the aluminum-patterned glass substrate side was sufficiently cured. Furthermore, the joining was performed at 210° C.; i.e., at a pressure-bonding temperature increased by 20° C., but the resin located at the aluminum-patterned glass substrate side was cured before the IC chip was pressed thereinto, resulting in that good conduction reliability was not able to be achieved.

Also, as shown in Table 2-2, the joined structure of Comparative Example 7 contains an anisotropic conductive film composed of a cationic-curable electrode-adhering sheet located at the IC chip side and a radical-curable electrode-adhering sheet located at the aluminum-patterned glass substrate side and thus, the anisotropic conductive film was found to be peeled off, since it was not able to maintain sufficient connection strength with both the aluminum-patterned glass substrate and the IC chip B (containing a passivation film of polyimide).

Also, as shown in Table 2-2, the joined structures of Comparative Examples 8 to 10 each contain an anisotropic conductive film employing a photocuring system and thus, the conductive particles were not sufficiently crushed and the interstices were formed therearound, resulting in that high conduction reliability was not be able to achieved. One possible reason for this lies in the resin of the anisotropic conductive film was not sufficiently cured.

What is claimed is:

1. A method for producing a joined structure, the method comprising:
    pressure-bonding first and second circuit members together via an anisotropic conductive film while the circuit members are being heated, to thereby join the circuit members with each other,
    wherein the anisotropic conductive film electrically connects the first circuit member with the second circuit member having a nitrogen atom-containing film on a surface thereof facing the first circuit member,
    wherein the anisotropic conductive film comprises a first layer which is to be located at a first circuit member side, and a second layer which is to be located at a second circuit member side,
    wherein the first layer comprises a cationic curing agent and a first thermosetting resin, and the second layer comprises a radical curing agent and a second thermosetting resin,
    wherein at least one of the first and second layers comprises conductive particles, and the difference in maximum exothermic peak temperature between the first and second layers is within the range of 0 to 20° C., and
    wherein the first thermosetting resin is an epoxy resin and the second thermosetting resin is an acrylic resin.

2. The method for producing a joined structure according to claim 1, wherein the cationic curing agent is a sulfonium salt, and the radical curing agent is an organic peroxide.

3. The method for producing a joined structure according to claim 1, wherein the conductive particles are metal particles or metal-coated resin particles.

4. The method for producing a joined structure according to claim 1, wherein the second circuit member is made of a material which does not transmit light, and the first circuit member contains a metallic material.

\* \* \* \* \*